(12) United States Patent
Signer et al.

(10) Patent No.: US 8,014,156 B2
(45) Date of Patent: Sep. 6, 2011

(54) STORAGE BLADE

(75) Inventors: Ryan S. Signer, Derby, KS (US);
Robert T. Harvey, Wichita, KS (US)

(73) Assignee: Netapp, Inc., Sunnyvale, CA (US)

( * ) Notice: Subject to any disclaimer, the term of this patent is extended or adjusted under 35 U.S.C. 154(b) by 730 days.

(21) Appl. No.: 12/100,520

(22) Filed: Apr. 10, 2008

(65) Prior Publication Data

US 2009/0257185 A1  Oct. 15, 2009

(51) Int. Cl.
*H05K 5/00* (2006.01)
(52) U.S. Cl. .................................................... 361/752
(58) Field of Classification Search ............... 361/730, 361/752, 790, 797, 800, 727, 737, 756, 741, 361/686, 802; 312/223.1, 223.2; 439/377, 439/374; 248/694, 298.1, 638
See application file for complete search history.

(56) References Cited

U.S. PATENT DOCUMENTS 7,042,717 B2 *  5/2006  El-Batal et al. ........... 361/679.33
7,245,499 B2 *  7/2007  Stahl et al. ..................... 361/754

* cited by examiner

*Primary Examiner* — Lisa Lea-Edmonds
*Assistant Examiner* — Xanthia Cunningham
(74) *Attorney, Agent, or Firm* — Haynes and Boone, LLP

(57) ABSTRACT

A blade-system computer component with a chassis and a blade. The chassis has a housing for a blade, chassis electrical contacts for making electrical connections to the blade, and two rails for engaging the blade along two sides of a length of the blade. Each of the two rails has a slider portion and a rack portion that both engage the blade, and are both disposed along an entire length of the two rails. The blade has blade electrical contacts for making electrical connections to the chassis, two glides disposed along the entire length of the two sides of the blade, where each of the two glides engage the slider portion of each of the two rails, and provide stability to the blade during relative movement between the blade and the chassis. At least one pinion engages the rack portion of at least one of the two rails, and provides dampening to the relative movement between the blade and the chassis.

8 Claims, 4 Drawing Sheets

STORAGE BLADE

FIELD

This invention relates to the field of computer hardware. More particularly, this invention relates to designs for storage blades.

BACKGROUND

As with most things electronic, there is a desire to continually make computers smaller and smaller, or in other words, to put the same or a greater amount of computing power within a given amount of space. As a part of this process, blade computing designs were developed.

Blade designs put some aspects of a computer on a card (referred to as a blade) that is inserted into an enclosure (also referred to as a chassis), where the chassis provides other aspects of the computer. Typically, the chassis is designed to accommodate several blades, such as four, eight, nine, sixteen, etc. The chassis typically provides elements of the system that can be commonly used for all of the blades in the system, which elements might be unnecessarily redundant if these elements were individually provided by each of the blades.

For example, power supply, cooling, and network or bus communications are typically provided by the chassis. These services might be provided in a redundant manner, but are provided in a manner that reliability and uptime are enhanced without unnecessarily providing duplicated services. The blade portion of the design is removable from the chassis and can be replaced or augmented, typically without powering down or otherwise taking the other blades off-line.

The blade computing design can be applied to different aspects of a computing system. For example, computers themselves can be configured into a blade design, where each blade in the system provides computing power with memory and a central processing unit. The blade concept can also be applied to data storage, with devices called storage blades or, alternately, drive blades. Storage blades typically hold some number of individual hard drives, such as two, four, seven, eight, etc.

Because of the delicate nature of hard drives, they generally must be handled very carefully while they are spinning, and also at other times. Thus, it tends to be important for the blade to mate smoothly and firmly with the chassis, and for insertion and removal of the blade to be accomplished without damaging the blade or chassis components. However, providing for such blade handling can be very expensive.

What is needed, therefore, is a system that overcomes problems such as those described above, at least in part.

SUMMARY

The above and other needs are met by a blade-system with a chassis and a blade. The chassis has a housing for a blade, chassis electrical contacts for making electrical connections to the blade, and two rails for engaging the blade along two sides of a length of the blade. Each of the two rails has a slider portion and a rack portion that both engage the blade, and are both disposed along an entire length of the two rails. The blade has blade electrical contacts for making electrical connections to the chassis, two glides disposed along the entire length of the two sides of the blade, where each of the two glides engage the slider portion of each of the two rails, and provide stability to the blade during relative movement between the blade and the chassis. At least one pinion engages the rack portion of at least one of the two rails, and provides dampening to the relative movement between the blade and the chassis.

In various embodiments, the chassis accommodates more than one blade, and one rail is disposed between each two adjacent blades, where the rails disposed between two blades have slider portions and rack portions disposed along the entire length of two sides of the rail. In some embodiments the blade includes a motor attached to the pinion, for providing the relative movement between the blade and chassis. The blade includes a dampener attached to the pinion in some embodiments, for dampening the relative movement between the blade and the chassis. In some embodiments the blade includes two pinions, one pinion on each side of the blade, one of each of the two pinions for engaging the rack on the rail disposed on an associated side of the blade. In some embodiments the blade is a storage blade. The blade in some embodiments includes a handle for providing the relative movement and for carrying the blade when it is not disposed within the chassis, where the handle includes status indicators for operation of components on the blade.

BRIEF DESCRIPTION OF THE DRAWINGS

Further advantages of the invention are apparent by reference to the detailed description when considered in conjunction with the figures, which are not to scale so as to more clearly show the details, wherein like reference numbers indicate like elements throughout the several views, and wherein.

DETAILED DESCRIPTION

Figure 1:
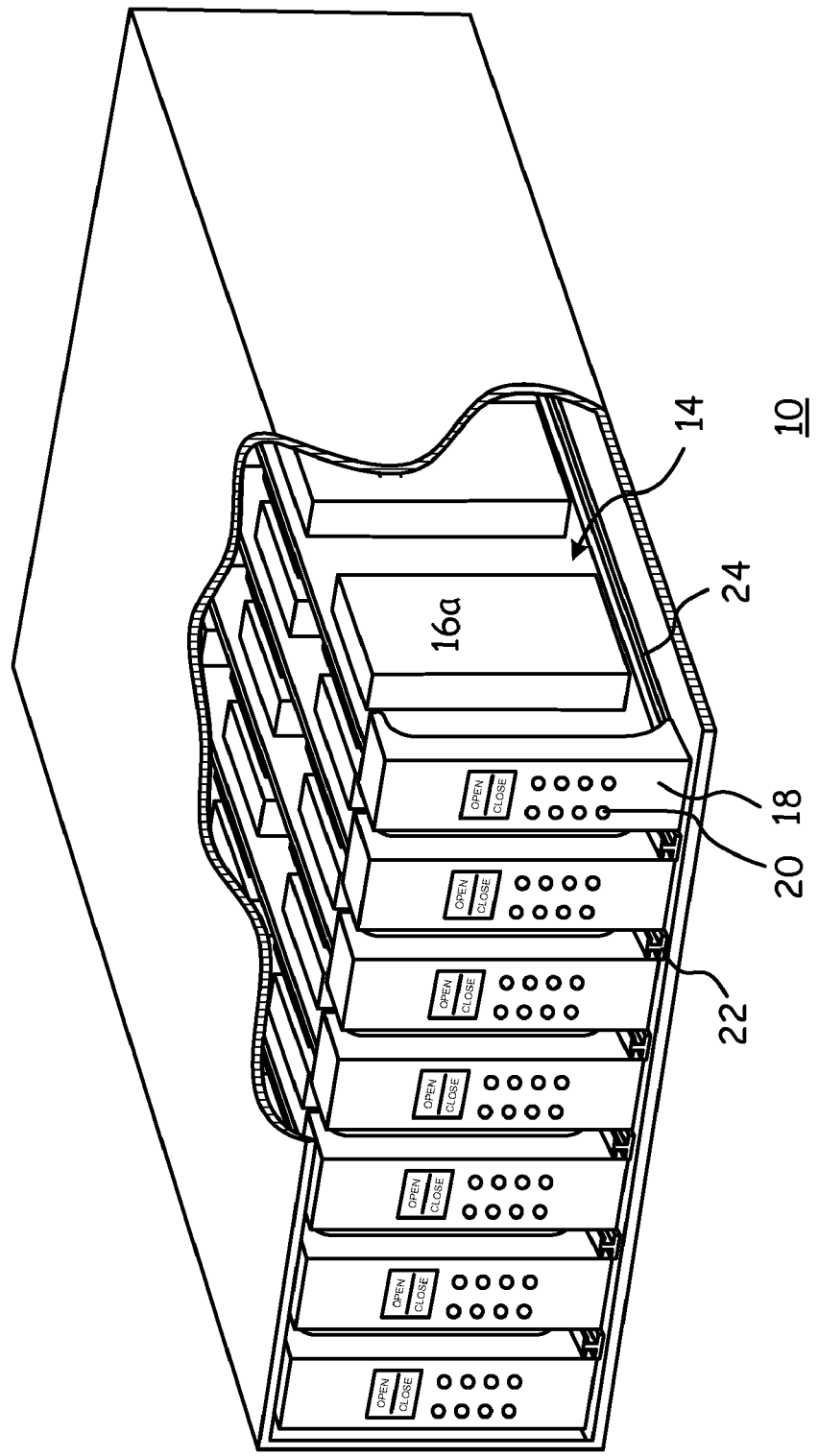
FIG. 1 is a cut-away perspective view of several blades residing in a chassis, according to an embodiment of the present invention.

With reference now to FIG. 1, there is depicted a cut-away perspective view of a blade system 10 according to an embodiment of the present invention, including a chassis 12 and multiple storage blades 14. As depicted in FIG. 1, the storage blades 14 each hold several hard drives 16a, 16b, etc., the precise number of which is not determined by the present invention.

The blades 14 slide into the chassis 12 along guide rails 22 that are mounted to the chassis 12, which rails 22 engage strip sliders 24 that are mounted to the blades 14. The sliders 24 on the blades 14 are slotted into the rails 22 on either side of each blade 14, and then the blade 14 is inserted into the chassis 12 either by pushing it in, or by engagement of a motorized means, as described in more detail hereafter. Optionally, a slotted guide is also provided along the inside of the top of the chassis 12, which engages the top edge of the blade 14, or an element depending therefrom, and provides additional stability to the blade 14 by prohibiting excessive movement of the top of the blade 14.

The blades 14 can be inserted into and removed from the chassis 12 by applying traction or pressure to a handle 18 that is mounted to the blade 14. The handle 20 is preferably formed of a material such as molded plastic, and is constructed so as to be sufficiently rigid and durable as to enable the reliable and repeated insertion, removal, and carrying of the blade 14 without structural failure. The handle 20 also includes status indicators 22, such as status lights, indicating the operation of each of the drives 16 in the blade 14, such as proper operation, failure of some type, and current read or write access.

Figure 2:
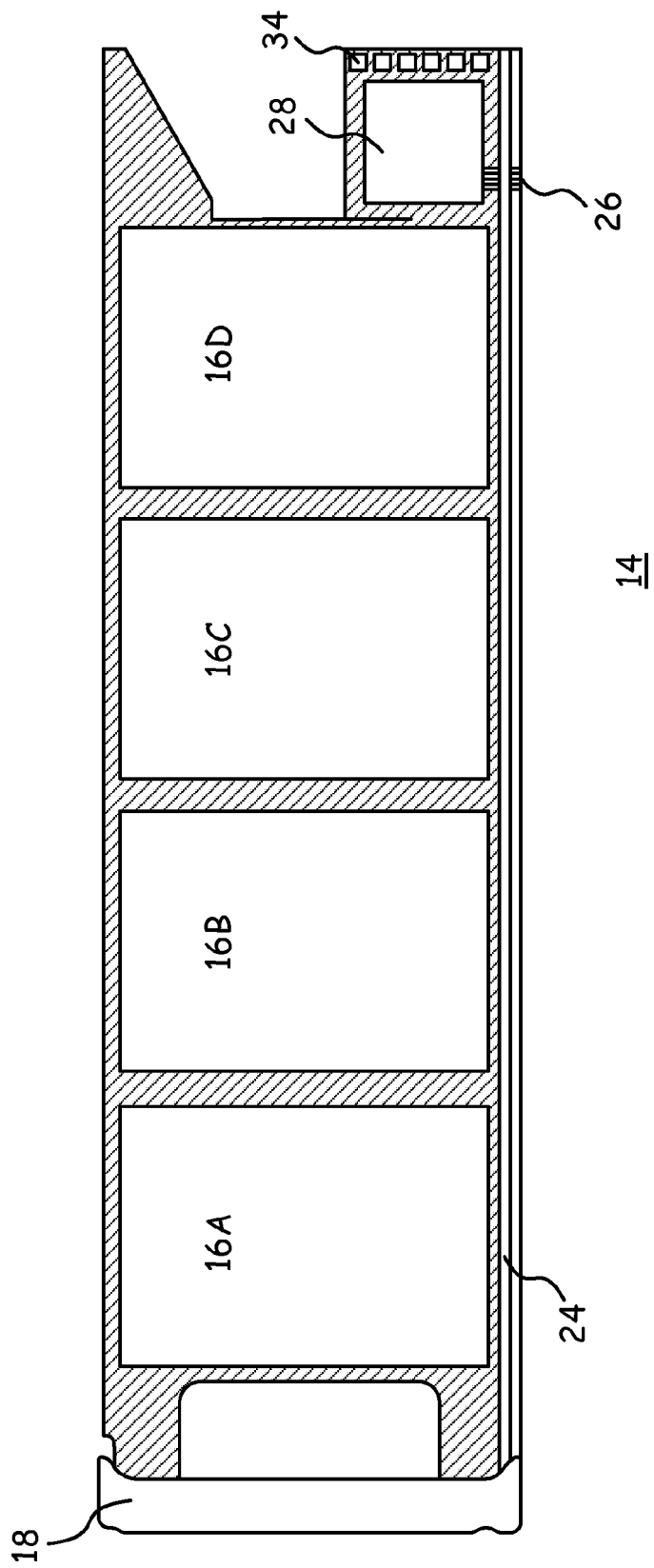
FIG. 2 is a profile view of a blade, according to an embodiment of the present invention.

With reference now to FIG. 2, there is depicted a profile view of the storage blade 14. The handle 18 is seen on the left of the blade 14, and the slider 24 is visible on the bottom of the blade 14. Also seen are four drives 16, in the example as depicted. On the right end of the blade 14, which represents the back end of the blade 14, which fits back into the chassis 12, there is depicted a pinion 26 that—in addition to the slider 24—also engages the rail 22 (not depicted). The pinion 26 in some embodiments is driven by a motor 28, and moves the blade 14 into and out of the chassis 12 in a smooth and steady manner. Back-plane electrical connections 34 are disposed to align and make electrical contact with the chassis 12, providing interaction such as control signals, data communications, and power.

Figure 3:
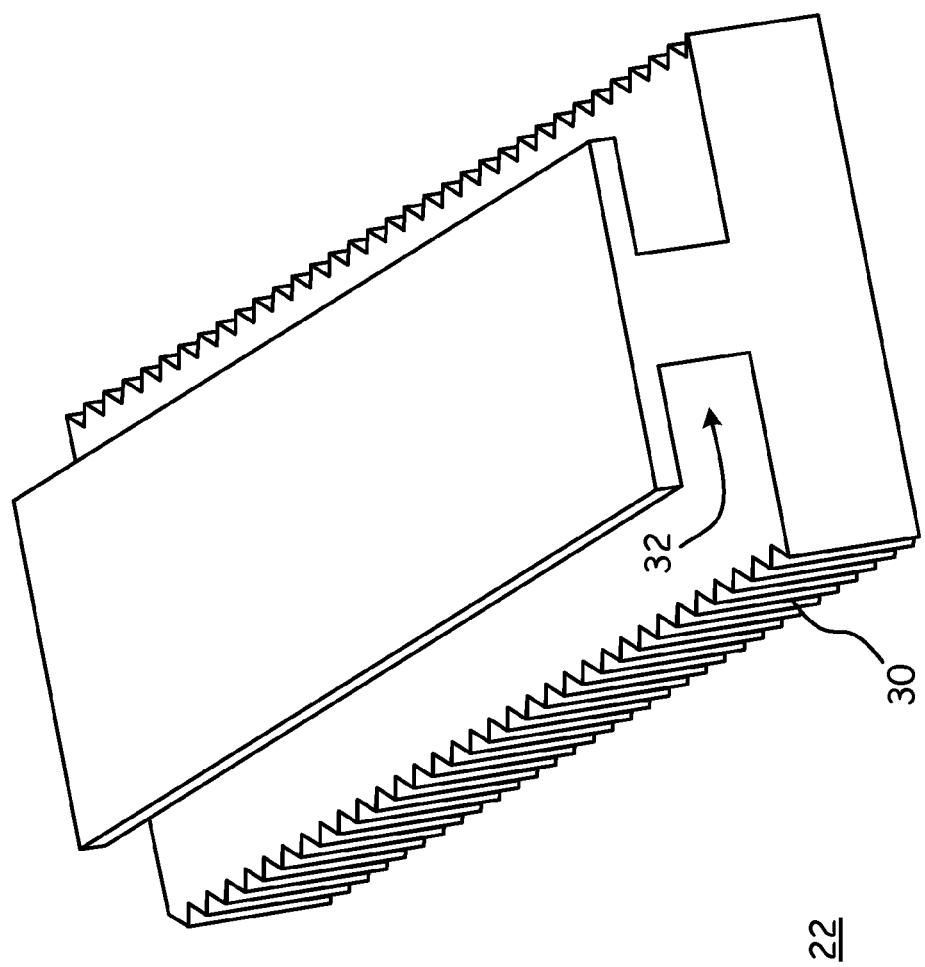
FIG. 3 is a perspective view of a portion of a rail, according to an embodiment of the present invention.

With reference now to FIG. 3, there is depicted a partial perspective view of a part of a rail 22. Visible in FIG. 3 are a rack portion 30 and a slider portion 32. These two portions 30 and 32 are disposed along both sides of the rails 22 that support a blade 14 on either side of the rail 22. Alternately, the rack 30 and the slider 32 are disposed along just one side of the raid 22 that is configured to accommodate a blade 14 on just one side of the rail 22, such as at one end of the chassis 12.

Figure 4:
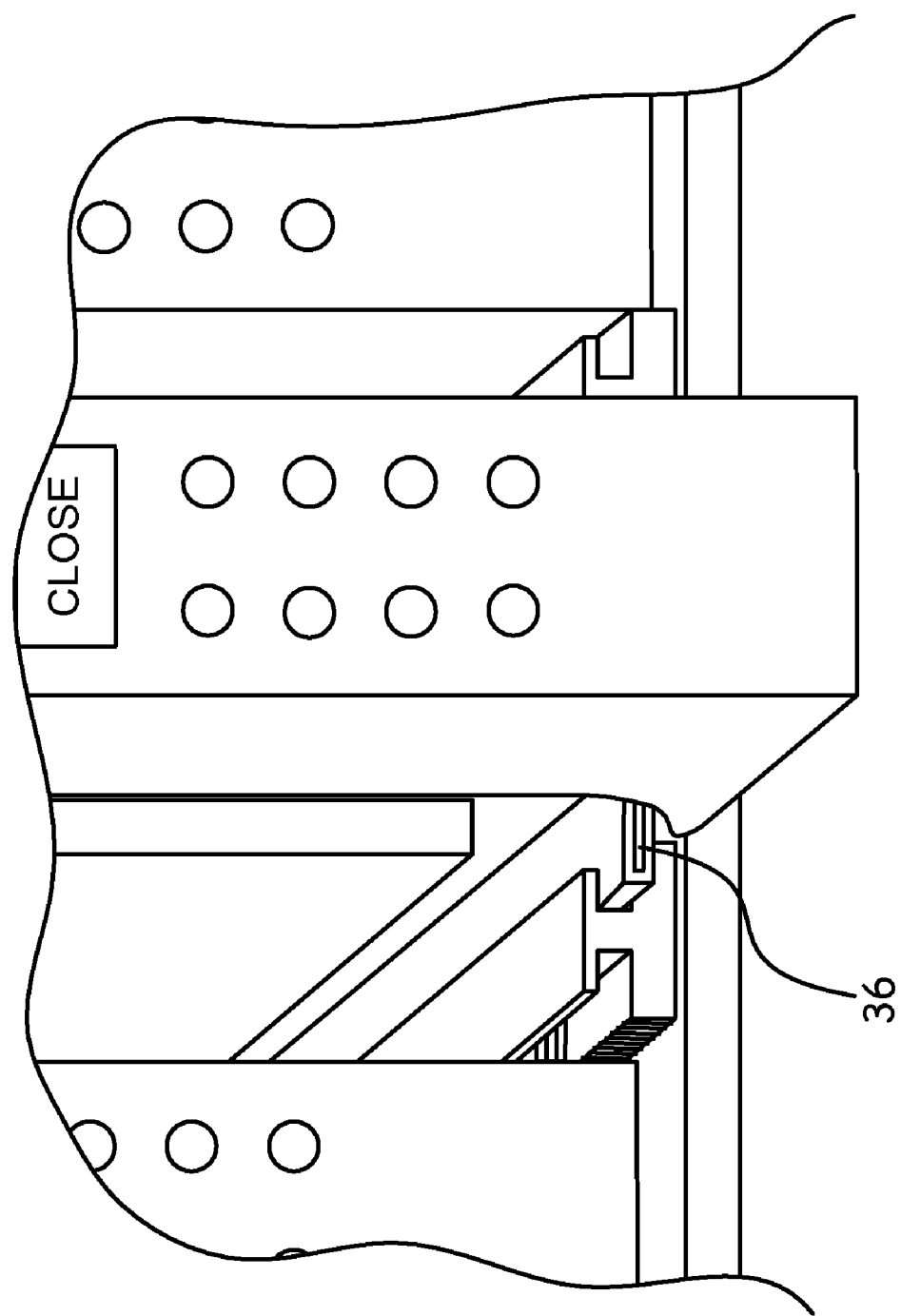
FIG. 4 is an enlarged cut-away perspective view of a blade residing in a chassis, showing addition detail of the interaction between the rail and the blade, according to an embodiment of the present invention.

The slider portion 32 of the rail 22 receives the glide 24 of the blade 14, and the rack portion 30 of the rail 22 receives the pinion 26 of the blade 14. Thus, the blade 14 engages two rails 22 in the chassis 12, one on either side of the blade 14, as depicted in FIG. 4. Further, each blade 14 engages a rail 22 by both a glide 24 in the slider 32, and a pinion 26 on the rack 30. These four points of contact between the rail 22 that is mounted to the chassis 12 and the blade 14, provide several benefits in the system 10.

The engagement between the sliders 32 and the glides 24 provides stability between the chassis 12 and the blade 14 along the entire length of the blade 14. This engagement prohibits the blade 14 from wobbling or tilting as it is inserted, ensuring that there is a good alignment between the back-plane electrical connections 34 on the rear edge of the blade 14 and the mating electrical connections at the rear of the chassis 12.

The engagement between the pinion 26 and the rack 30 provide dampening and control to the motions of inserting the blade 14 into the chassis 12 and removing the blade 14 from the chassis 12. The dampening and control action ensures that the blade 14 is not inserted in a violent or shock-prone manner, which might damage the drives 16 on the blade 14 being moved, or the other blades 14 in the chassis 12.

The dampening action can be provided through the racks 30 and pinions 26 in a variety of ways. For example, tensioning means can be provided on the pinions 26, which limit the motion of the pinions 26 to no more than a certain rotational rate. In this manner, the movement of the blade 14 into or out of the chassis 12 cannot be started too quickly—or jerked—and the motion also cannot be to fast, which undue speed might lead to some of the problems generally alluded to herein.

One method of providing tensioning means to the pinions 26 is through the motor 28. In this manner, a technician pushes or pulls with the handle 18 against the force of the motor 28, which dampens the movement of the blade 14. However, in another embodiment, the motor 28 itself drives the blade 14 into or out of the chassis 12, providing a smooth motion that is designed to protect all of the components of the system 10. The motor 28 can be activated, in various embodiments, by an initial motion of the blade 14 in one direction or the other, a switch, such as disposed on one or more of the chassis 12 and the blade 14, or a signal, such as sent remotely to the system 10 from a computer. The signal can be sent either upon command by a user, or automatically upon the detection of an event, such as a failure of the blade 14.

Close proximity between the dampening functions of the rack 30 and pinion 26 and the alignment functions of the slider 32 and glide 24 is provided in this embodiment, so as to enhance the effectiveness of both functions. Thus, providing both the dampening function of the rack 30 and the alignment function of the slider 32 in a single-piece rail 22 provides greater stability to the blade 14 in this embodiment, than is provided by embodiments where the rack 30 and the slider 32 are disposed in separate pieces.

The unified construction of the rack 30 and pinion 26 within the rail 24 also reduces the number of parts required for construction of the chassis 12. The profile of the rail 24 is, in the embodiment depicted, relatively low, so as to not take much room in the chassis 12, allowing more room within the chassis 12 for the blades 14. In this context, a relatively low profile indicates a width that is no less than twice the height of the rail 24.

As depicted in the embodiment of FIG. 4, at least one of the slider 32 and the glide 24 is clad with a low friction material 36, such as a natural or manmade thermoplastic resin, that provides for a smoother motion between the blade 14 and the rail 24. This aids in protecting the components of the system 10 from excessive vibration and from the other problems alluded to above. It also protects the slider 32 and the glide 24 from excessive wear, which can also lead to vibration and other problems. In one embodiment, at least one of the glide 24 and the rail 22 is formed of a durable rigid material, such as a metal like aluminum or steel. By extruding, machining, or otherwise forming the glide 24 and rail 22, a smooth and stable motion and retention can be provided between the blade 14 and the chassis 12.

The foregoing description of preferred embodiments for this invention has been presented for purposes of illustration and description. It is not intended to be exhaustive or to limit the invention to the precise form disclosed. Obvious modifications or variations are possible in light of the above teachings. The embodiments are chosen and described in an effort to provide the best illustrations of the principles of the invention and its practical application, and to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A blade-system computer component, comprising:
 a chassis having,
  a housing for a blade,
  chassis electrical contacts for making electrical connections to the blade, and
  two rails for engaging the blade along two sides of a length of the blade, each of the two rails having a slider portion and a rack portion that both engage the blade and are both disposed along an entire length of the two rails, and
 the blade having, blade electrical contacts for making electrical connections to the chassis, two glides disposed along the entire length of the two sides of the blade, each of the two glides for engaging the slider portion of each of the two rails, and for providing stability to the blade during relative movement between the blade and the chassis, and at least one pinion for engaging the rack portion of at least one of the two rails, and for providing dampening to the relative movement between the blade and the chassis.

2. The blade-system of claim 1, wherein the chassis accommodates more than one blade, and one rail is disposed between each two adjacent blades, and the rails disposed between two blades have slider portions and rack portions disposed along the entire length of two sides of the rail.

3. The blade-system of claim 1, wherein the blade includes a motor attached to the pinion, for providing the relative movement between the blade and chassis.

4. The blade-system of claim 1, wherein the blade includes a dampener attached to the pinion, for dampening the relative movement between the blade and the chassis.

5. The blade-system of claim 1, wherein the blade includes two pinions, one pinion on each side of the blade, one of each of the two pinions for engaging the rack on the rail disposed on an associated side of the blade.

6. The blade-system of claim 1, wherein the blade comprises a storage blade.

7. The blade-system of claim 1, wherein the blade includes a handle for providing the relative movement and for carrying the blade when it is not disposed within the chassis.

8. The blade-system of claim 1, wherein the blade includes a handle for providing the relative movement and for carrying the blade when it is not disposed within the chassis, the handle including status indicators for operation of components on the blade.

* * * * *